United States Patent [19]
Weber

[11] Patent Number: 5,339,048
[45] Date of Patent: Aug. 16, 1994

[54] RADIO FREQUENCY AMPLIFIER

[75] Inventor: Paul J. Weber, Elgin, Ill.

[73] Assignee: Motorola, Inc., Schaumburg, Ill.

[21] Appl. No.: 55,461

[22] Filed: May 3, 1993

[51] Int. Cl.$^5$ .............................................. H03F 3/191
[52] U.S. Cl. .................................... 330/302; 330/305
[58] Field of Search ............... 330/302, 303, 304, 305, 330/306; 455/341

[56] References Cited

U.S. PATENT DOCUMENTS

| | | | |
|---|---|---|---|
| 2,773,945 | 12/1956 | Theriault | 330/306 |
| 2,890,293 | 6/1959 | Overbeek | 330/306 |
| 3,456,206 | 7/1969 | Kwartiroff | 330/304 |
| 4,580,286 | 4/1986 | Richards, Jr. | 455/168 |
| 4,845,445 | 7/1989 | Rinderle | 330/306 |

*Primary Examiner*—Steven Mottola
*Assistant Examiner*—Tiep H. Nguyen
*Attorney, Agent, or Firm*—Timothy W. Markison

[57] ABSTRACT

An amplifier for amplifying RF signals comprises a transistor, a first impedance, an impedance transformer, and a tuned resonant circuit. The amplifier receives the RF signals via a signal terminal of the transistor, wherein the RF signals are amplified by the transistor, the tuned circuit, the first impedance, and the impedance transformer. The degree of amplification is based on the impedance ratio between the impedance transformer and the first impedance, wherein the first impedance may be an output impedance matching transformer.

11 Claims, 1 Drawing Sheet

RADIO FREQUENCY AMPLIFIER

FIELD OF THE INVENTION

This invention relates generally to radio frequency amplifiers and, in particular, to a radio frequency amplifier with resonant circuit tuning.

BACKGROUND OF THE INVENTION

Radio frequency amplifiers generally comprise a transistor, an input circuit, an output circuit, and components which set the bias point of the transistor. The transistor is a three terminal device that includes a signal terminal, an output terminal, and a return terminal. In a typical configuration, the transistor accepts radio frequency signals into its signal terminal, amplifies the signals based on the output terminal to return terminal impedance ratio, and transmits the amplified signal from its output terminal. The input and output circuits are used to provide amplifier selectivity, impedance matching to drive and load circuitry, and amplifier gain control. Typically, the input circuit may be utilized to match the transistor's input impedance to a driving circuit, such as an antenna or a driving transistor's output impedance, and the output circuit may be used to match the transistor's output impedance to a load circuit, such as the input to a mixer or a transistor's input impedance.

As is known, radio frequency amplifiers are inherently nonlinear circuits due to the transistor's internal composition. A radio signal entering the transistor's signal terminal may produce undesired output frequency components at harmonics of the radio signal if the radio signal strength is strong enough to drive the transistor out of its linear region. Common problems, such as harmonic distortion and intermodulation distortion, are also encountered due to nonlinear effects in radio frequency amplifiers. Harmonic distortion occurs when a strong radio signal at a frequency of one half the desired frequency enters the signal terminal of the transistor to produce an unwanted second harmonic output signal at the desired frequency. Intermodulation distortion occurs when two radio signals, one desired and one undesired, enter the signal terminal of the transistor and produce an unwanted output signal within the selectivity of the amplifier.

Common amplifier design practice relies on a parallel resonant circuit located between the transistor's output terminal and a DC voltage source to provide the amplifier's gain and frequency selectivity. Typically, the parallel resonant circuit includes an inductor in parallel with a voltage variable capacitor, or varactor, to allow DC voltage control of the amplifier's center frequency. The varactor comprises a reverse biased diode whose capacitance varies as a function of the DC bias.

Although simple in topology and implementation, the parallel resonant circuit has several shortcomings. First, the loaded quality factor, Q, of the parallel resonant circuit decreases as the amplifier's center frequency increases. This result degrades the selective bandwidth of the amplifier when the varactor capacitance decreases. Secondly, the amplifier provides limited rejection of harmonic distortion; typically in the 60 dB range. An additional 10 to 20 dB of rejection may be necessary for desired receiver sensitivity. Finally, AC voltage excursions exhibited across the varactor, due to the output radio signal, cause instantaneous capacitance variations. These variations produce additional output signal distortion which is even greater when a small DC voltage is applied across the varactor.

To overcome some of the parallel resonant circuit's performance issues, the amplifier may include a series resonant circuit incorporated between the transistor's return terminal and a signal common. Typically, the series resonant circuit includes an inductor in series with a varactor to permit DC control of the amplifier's center frequency. Contrary to its parallel counterpart, the loaded Q of the series resonant circuit increases as the amplifier's center frequency increases; thus, the bandwidth of the amplifier remains constant as varactor capacitance decreases. Additionally, the series resonant circuit improves rejection of harmonic distortion by reducing the amplifier's gain at the half carrier frequency. This also prevents the amplifier from leaving its linear operating region and creating harmonic output signals.

Although the series resonant circuit solves two of the three critical performance issues encountered when utilizing the parallel resonant circuit approach, it also creates new problems. First, in the typical configuration, the amplifier necessitates a DC current path from the transistor's return terminal to the signal common in order to allow a return path for the DC current. The presence of the varactor in the series resonant circuit prevents DC current flow from the transistor's return terminal to the signal common. Further, in order to attain the desired amplifier selectivity, the reactive component impedances utilized in the series resonant circuit may be considerably larger than those used in the parallel resonant circuit approach. Depending on amplifier center frequency, obtaining usable series resonant circuit components may become an obstacle due to their extraordinarily large or small values. Finally, to provide amplifier gain comparable to that obtained with a tuned parallel resonant circuit, the impedance of the transistor's return terminal must remain small enough such that the output terminal to return terminal impedance ratio for the amplifier with the tuned series resonant circuit is similar to that for the amplifier with the tuned parallel resonant circuit.

Therefore, a need exists for a radio frequency amplifier that provides the advantages of both the series resonant circuit and the parallel resonant circuit without their respective limitations.

DESCRIPTION OF A PREFERRED EMBODIMENT

Figure 1:
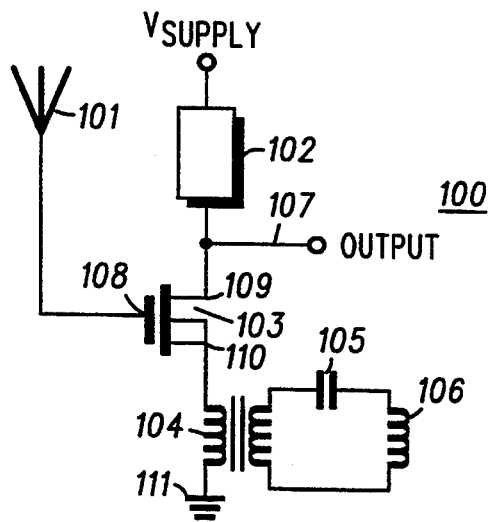
FIG. 1 illustrates a schematic depiction of an amplifier in accordance with the present invention.

FIG. 1 illustrates a schematic depiction of a radio frequency (RF) amplifier 100 that comprises an antenna 101, a first impedance 102, a transistor 103, an impedance transformer 104, and a signal common 111. The impedance transformer 104 includes a primary winding and a secondary winding and has its primary winding operably coupled between a return terminal 110 of the transistor 103 and the signal common 111. A tuned series resonant circuit, that may include a capacitor 105 and an inductor 106, is coupled across the secondary winding to provide selectivity in the RF amplifier 100. DC power required by the transistor 103 is supplied from a voltage supply source to a supply terminal 109 of the transistor 103. The amplifier 100 amplifies an incident RF signal when it is received by the antenna 101 and enters a signal terminal 108 of the transistor 103. The transistor 103 amplifies the RF signal, which exits the transistor 103 via its supply terminal 109. The amplified signal continues to the amplifier's output terminal 107 where it becomes available as a drive source for a succeeding circuit.

In amplifier topologies of the type depicted in FIG. 1, the incident signal is amplified based on an impedance ratio of two impedances contained in the RF amplifier 100. As is known, this impedance ratio is referred to as the gain of the RF amplifier 100 at the incident signal frequency. Neglecting internal impedances of the transistor 103, the gain of the RF amplifier 100 is approximately derived by dividing the impedance viewed from the transistor's supply terminal 109 by the impedance viewed from the transistor's return terminal 110. In this case, the impedance viewed from the transistor's supply terminal 109 is the first impedance 102 and the impedance viewed from the transistor's return terminal 110 is the impedance looking into the primary winding of the impedance transformer 104. Therefore, maximum gain is achieved when the first impedance 102 is large and the impedance looking into the primary winding of the impedance transformer 104 is small. A typical range for the gain of the RF amplifier 100 may be 10 dB to 20 dB depending on the type of transistor 103 and the incident signal frequency.

The bandwidth of the RF amplifier 100 is determined by evaluating the ratio of the reactance of either the capacitor 105 or the inductor 106, as viewed looking into the primary winding of the impedance transformer 104, to the resistance associated with the transistor's return terminal 110 at the amplifier's center frequency. As is known, this ratio forms the Q of the RF amplifier 100. If the Q is large, the bandwidth is narrow because the total reactance of the capacitor 105 and the inductor 106 increases rapidly as the incident frequency deviates from the center frequency. For example, assume the internal resistance of the transistor's return terminal 110 is 50 ohms, the reactances of the capacitor 105 and the inductor 106 are both 1000 ohms, and the impedance transformer 104 has a one to one turns ratio. This scenario provides an amplifier Q of 20. If the input frequency increases above the amplifier's center frequency by 5%, the total reactance of the capacitor 105 and the inductor 106 is now 100 ohms. As a result, the total impedance at the transistor's return terminal 110 has gone from its own 50 ohms to 150 ohms total. This reduces the amplifier gain by a factor of 3 or almost 10 dB. If the reactances of the capacitor 105 and the inductor 106 are both changed to 50 ohms at resonance, resulting in an amplifier Q of 1, and the input frequency increases by 5%, the total reactance of the capacitor 105 and the inductor 106 will now be 5 ohms. As a result, the total impedance at the transistor's return terminal 110 is now 55 ohms, which reduces the amplifier gain by only about 1 dB. Therefore, to obtain adequate selectivity, the RF amplifier 100 may require a Q in the 10 to 20 range.

The transistor 103 may be selected from a variety of semiconductor devices, such as field effect transistors (FET) or bipolar junction transistors (BJT). If a FET is utilized for the transistor 103, the signal terminal 108 may be referred to as a gate, the supply terminal 109 may be referred to as a drain, and the return terminal 110 may be referred to as a source. If a BJT is used, the signal terminal 108, the supply terminal 109, and the return terminal 110 may be referenced as a base, a collector, and an emitter, respectively.

The impedance transformer 104 serves two functions in the RF amplifier 100. First, the impedance transformer 104 provides a DC path from the transistor's return terminal 110 to the signal common 111. This path allows DC current to complete a loop that initiates from the voltage supply, continues through the transistor 103, and returns to the voltage supply. Secondly, the impedance transformer 104 provides the necessary impedance at incident RF frequencies to allow high Q, narrow band performance of the RF amplifier 100. The impedance looking into the primary winding of the impedance transformer 104 is derived by multiplying the impedance of the tuned circuit by the square of the turns ratio of the impedance transformer 104. This impedance should be small over the desired frequency bandwidth and large at all other frequencies to achieve desired selectivity. The turns ratio is selected to permit utilization of practical element values for the capacitor 105 and the inductor 106 based on the desired bandwidth or Q. For example, a turns ratio of 3.16 to 1 raises the impedance of the tuned circuit, as viewed from the primary winding, by a factor of ten allowing the inductor 106 to be one tenth and the capacitor 105 to be ten times the values they would have to be to provide high Q amplifier operation if they were connected in series with the transistor's return terminal 110.

Fabrication of the impedance transformer 104 may require a meticulous procedure to insure minimization of stray interwinding capacitances. Depending on the desired frequency range, stray capacitances as small as a few picofarads may degrade the out of band rejection of the RF amplifier 100. For example, at low frequencies which may include the desired frequency range, the impedance of the impedance transformer 104 is very low, resulting in high amplifier gain. However, at very high frequencies, the stray capacitances also produce a low impedance of the impedance transformer 104, resulting in undesired high amplifier gain and minimal signal rejection at those high frequencies. For low RF amplifier center frequencies, the impedance transformer 104 may be fabricated by winding the primary winding and the secondary winding around a ferrite core; whereas, for high center frequencies, the impedance transformer 104 may be constructed with transmission lines. A typical impedance transformer 104 may have a self resonant frequency in the 15 to 20 MHz range and provide sufficient out of band rejection over a two decade frequency range.

Figure 2:
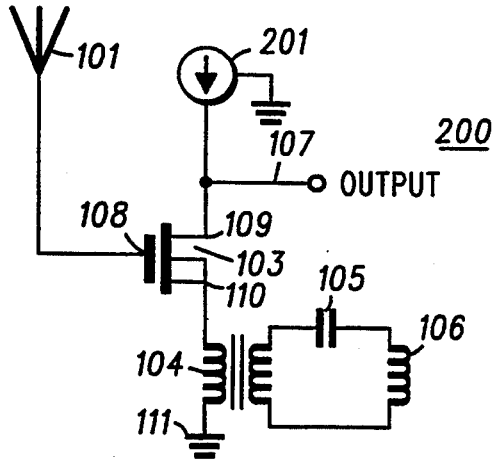
FIG. 2 illustrates an alternative schematic depiction of an amplifier in accordance with the present invention.

FIG. 2 illustrates a schematic depiction of an alternative RF amplifier 200 to that shown in FIG. 1. This amplifier 200 comprises the antenna 101, the transistor 103, the impedance transformer 104, and the signal common 111. The tuned series resonant circuit is connected across the secondary winding of the impedance transformer 104 and the amplified signal exits the RF amplifier 200 via its output terminal 107 as previously discussed with reference to FIG. 1. In this embodiment, the transistor 103 receives its DC power from an ideal current source 201 that has a very large output impedance. The current source 201 is typically fabricated with electronic circuits that try to maintain a constant current output regardless of the instantaneous voltage at the transistor's supply terminal 109. The gain of this amplifier 200 is controlled by the impedance viewed looking into the primary winding of the impedance transformer 104, i.e. the impedance of the tuned circuit reflected through the impedance transformer 104.

Figure 3:
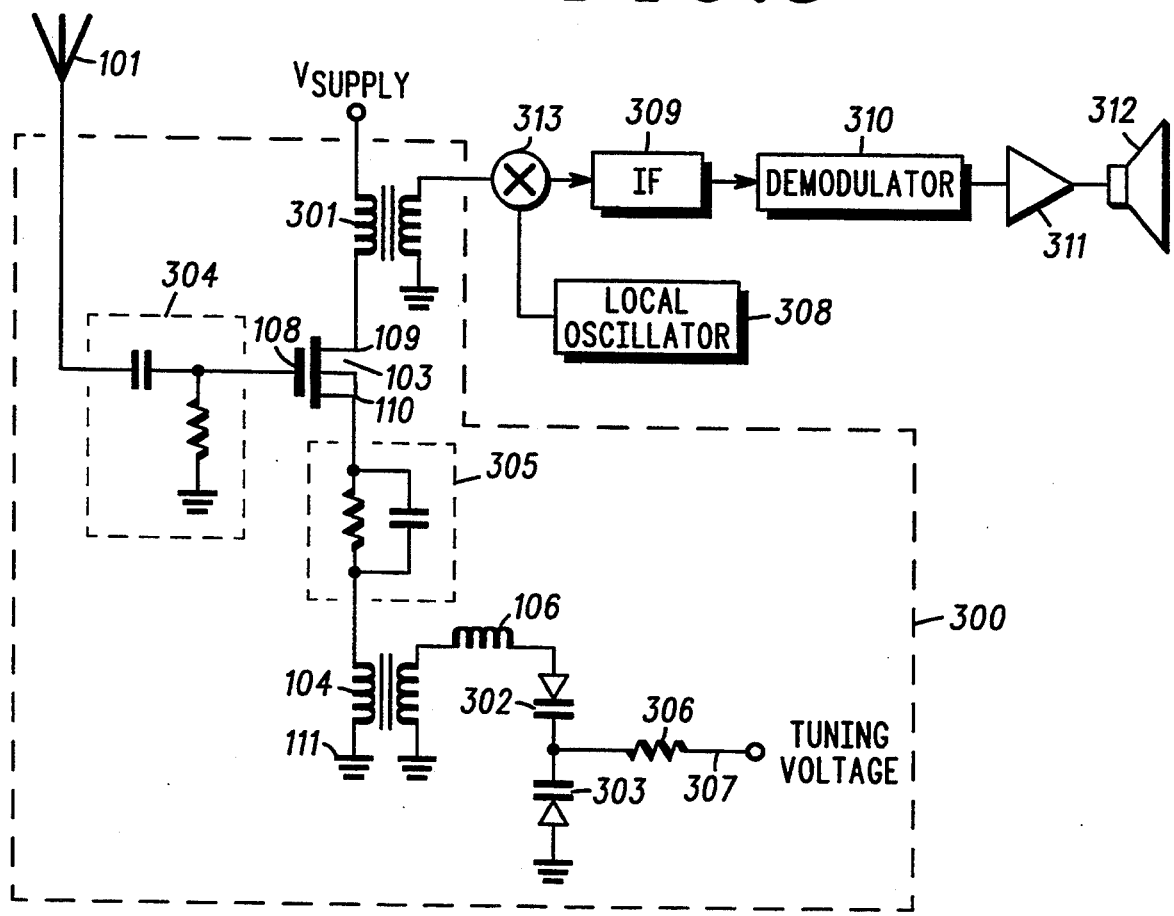
FIG. 3 illustrates a schematic and block diagram depiction of a communications receiver that includes an amplifier in accordance with the present invention.

FIG. 3 illustrates a schematic and block diagram depiction of an RF amplifier 300 in a communication device. The amplifier 300 comprises the antenna 101, the transistor 103, the impedance transformer 104, the signal common 111, an impedance matching transformer 301, and DC bias and RF coupling circuitry 304 and 305 respectively. The impedance matching transformer 301 includes a primary winding and a secondary winding and has its primary winding operably coupled to the transistor's supply terminal 109 and the voltage supply source. The secondary winding of the impedance matching transformer 301 is connected in an unbalanced configuration between the signal common 111 and an input to a succeeding stage of the communication device. The impedance transformer 104 has its secondary winding connected in an unbalanced configuration between the signal common 111 and a modified version of the tuned series resonant circuit. This modified tuned circuit includes the inductor 106, two reverse biased varactor diodes 302 and 303, a series resistor 306, and a tuning voltage 307. As also depicted in FIG. 3, the communication device comprises the RF amplifier 300, a mixer block 313, a local oscillator (LO) block 308, an intermediate frequency (IF) block 309, a demodulator block 310, an audio amplifier block 311, and a speaker 312. Arrows between the mixer 313 and IF 309 blocks and between the IF 309 and demodulator 310 blocks identify the direction of signal flow.

The incident RF signal received by the antenna 101 passes through a coupling capacitor contained in the RF coupling circuitry 304 and enters the signal terminal 108 of the transistor 103. Amplification of the incident signal occurs within the transistor 103 based on its DC operating point and an amplified output signal exits the transistor's supply terminal 109 to enter the primary winding of the impedance matching transformer 301. The amplified signal propagates through the impedance matching transformer 301 and arrives at the secondary winding such that the secondary winding provides the amplified output signal to the mixer 313 input. The DC operating point of the transistor 103 is set by establishing a DC current through the transistor 103, without any incident RF energy applied to the transistor's signal terminal 108. The elements used to generate the DC current do not affect RF operation of the RF amplifier 300. The DC current is established by proper selection of resistors and capacitors contained in the DC bias and RF coupling circuitry 304 and 305.

Selectivity of the RF amplifier 300 is achieved by varying the tuning voltage 307 in the modified tuned circuit. Variation of the tuning voltage 307 corresponds to changes in the resonant frequency of the modified tuned circuit and, accordingly, to changes in the RF amplifier's center frequency since the capacitances of both varactors 302 and 303 are direct functions of applied voltage. The impedance transformer 104 raises or lowers the impedance of the modified tuned circuit by the square of its turns ratio and presents this transformed impedance to the return terminal 110 of the transistor 103. As is known from transformer theory, if the impedance transformer 104 raises the impedance of the modified tuned circuit as viewed from the transistor's return terminal 110, a voltage across the impedance transformer's primary winding is larger than a voltage across its secondary winding by its turns ratio; thus, any variation in the voltage across the impedance transformer's primary winding should result in smaller voltage variations across its secondary winding. This result may be used in the present invention to minimize center frequency deviation, reduce distortion, and enhance selectivity of the RF amplifier 300 by minimizing the capacitance variation of the varactors 302 and 303 due to changes in the voltage across the impedance transformer's primary winding.

As previously mentioned with regard to FIG. 1, the gain of the RF amplifier 300 is approximately equal to the impedance viewed from the transistor's supply terminal 109 divided by the impedance viewed from the transistor's return terminal 110. Typically, the output impedance matching transformer 301 has a predetermined turns ratio that allows it to transform the transistor's output impedance to the input impedance of the succeeding stage, in this case, the mixer 313. This turns ratio is fixed based on the selected transistor 103 and the input impedance of the mixer 313, typically fifty ohms. Therefore, the impedance viewed from the transistor's supply terminal 109, i.e. the impedance into the primary winding of the impedance matching transformer 301, is also fixed based on the chosen transistor 103 and the input impedance of the mixer 313. To achieve desired gain, the impedance viewed from the transistor's return terminal 110, i.e. the impedance into the primary winding of the impedance transformer 104, should be small enough to overcome any limitation ensued by use of the impedance matching transformer 301. Thus, the turns ratio of the impedance transformer 104 may be directly dependant on the input impedance of the impedance matching transformer 301 and the impedance of the modified tuned circuit.

Functionality of the complete communication device necessitates the utilization of a narrow band RF amplifier similar to that of the present invention. Multiple incident RF signals enter the antenna 101 and propagate to the input of the RF amplifier 300. The RF amplifier 300 selectively amplifies the frequencies in its operational bandwidth and outputs those signals to the input of the mixer 313, thus reducing the number of spurious responses to undesired signals in the communication device. The mixer 313 receives the signals from the RF amplifier 300 and the local oscillator 308, multiplies the signals, produces two output signals whose frequencies are equal to the sum and the difference of its input frequencies, and delivers the two signals to the IF block 309 input. The IF block 309 selects the appropriate signal from the mixer 313, amplifies it, and outputs it to the demodulator 310. The demodulator 310 recovers the original modulation information from the IF signal and provides the information to the input of an audio amplifier 311 or data recovery device where it is sufficiently amplified to drive a speaker 312 or supply digital circuits of a computer.

The present invention makes the inclusion of a voltage tuned series resonant circuit between the return terminal of a transistor and the signal common practical in an RF amplifier by utilizing an impedance transformer. One of the advantages of placing the tuned circuit in this location is that the bandwidth of the RF amplifier remains constant as the resonant frequency of the tuned circuit is varied over its entire tuning range.

The constant bandwidth occurs because the reactance of the inductor and the varactor diodes that comprise the tuned circuit increase as the resonant frequency increases. Another benefit is that the response of the amplifier to sub-harmonic frequencies is greatly reduced. This is because the high reactance of the tuned circuit outside the bandwidth of the amplifier results in a large amount of degenerative feedback, thereby reducing distortion products produced by out of band signals. Further, the impedance transformer provides a DC current path from the transistor to the signal common which is an impossibility when only a series resonant circuit is used. This DC current return path is critical to insure optimum functionality of the RF amplifier. Still further, the present invention allows the amplifier bandwidth to be controlled independent of the component values in the tuned circuit by varying the turns ratio of the impedance transformer. This characteristic allows varactor diodes to provide voltage controlled tuning of the amplifier's center frequency. Varactor diodes are only available in certain values which are typically too low in reactance to be practical for use in the signal return lead of the transistor without using the impedance transformer.

I claim:

1. An amplifier that amplifies radio frequency signals, the amplifier comprises:
   a transistor that has a signal terminal, a supply terminal, and a return terminal, wherein the signal terminal receives the radio frequency signals;
   an output impedance matching transformer operably coupled to the supply terminal and a voltage supply source;
   an impedance transformer having a primary winding and a secondary winding, wherein the primary winding is operably coupled to the return terminal and a signal common, wherein the impedance transformer has a predetermined turns ratio between the primary winding and the secondary winding, and wherein gain of the amplifier substantially equals an impedance of the output impedance matching transformer divided by an impedance of the impedance transformer; and
   a tuned series resonant circuit operably coupled to the secondary winding of the impedance transformer.

2. In the amplifier of claim 1, the impedance transformer has stray capacitance below a predetermined capacitance.

3. In the amplifier of claim 1, the tuned series resonant circuit comprises an inductor and at least one varactor diode operably coupled to the secondary winding of the impedance transformer via the inductor.

4. A communication device that includes an amplifier, a mixer, coupled to the amplifiers, and a demodulator, operably coupled to the mixer, wherein the amplifier comprises:
   a transistor that has a signal terminal, a supply terminal, and a return terminal, wherein the signal terminal receives radio frequency signals;
   an output impedance matching transformer operably coupled to the supply terminal and a voltage supply source;
   an impedance transformer having a primary winding and a secondary winding, wherein the primary winding is operably coupled to the return terminal and a signal common, wherein the impedance transformer has a predetermined turns ratio between the primary winding and the secondary winding, and wherein gain of the amplifier substantially equals an impedance of the output impedance matching transformer divided by an impedance of the impedance transformer; and
   a tuned series resonant circuit operably coupled to the secondary winding of the impedance transformer.

5. In the communication device of claim 4, the impedance transformer has stray capacitance below a predetermined capacitance.

6. In the communication device of claim 4, the tuned series resonant circuit comprises an inductor and at least one varactor diode operably coupled to the secondary winding of the impedance transformer via the inductor.

7. An amplifier that amplifies radio frequency signals, the amplifier comprises:
   a transistor that has a signal terminal, a supply terminal, and a return terminal, wherein the signal terminal receives the radio frequency signals;
   an impedance matching transformer having a primary winding and a secondary winding, wherein the primary winding is operably coupled to the supply terminal and a voltage supply source and wherein the secondary winding provides an amplified output signal;
   an impedance transformer having a primary winding and a secondary winding, wherein the primary winding is operably coupled to the return terminal and a signal common, wherein the impedance transformer has a predetermined turns ratio between the primary winding and the secondary winding, wherein the predetermined turns ratio is at least partially dependant on impedance of the impedance matching transformer, and wherein gain of the amplifier substantially equals an impedance of the impedance matching transformer divided by an impedance of the impedance transformer; and
   a tuned series resonant circuit operably coupled to the secondary winding of the impedance transformer.

8. In the amplifier of claim 7, the impedance transformer has stray capacitance below a predetermined capacitance.

9. In the amplifier of claim 7, the tuned series resonant circuit comprises an inductor and at least one varactor diode operably coupled to the secondary winding of the impedance transformer via the inductor.

10. An amplifier that amplifies radio frequency signals, the amplifier comprises:
    a transistor that has a signal terminal, a supply terminal, and a return terminal, wherein the signal terminal receives the radio frequency signals;
    a current source operably coupled to the supply terminal;
    an impedance transformer having a primary winding and a secondary winding, wherein the primary winding is operably coupled to the return terminal and a signal common and wherein the impedance transformer has a predetermined turns ratio between the primary winding and the secondary winding;
    an inductor; and at least one varactor diode operably coupled to the secondary winding of the impedance transformer via the inductor.

11. In the amplifier of claim 10, the impedance transformer has stray capacitance below a predetermined capacitance.

* * * * *